United States Patent
Takajo et al.

(10) Patent No.: US 11,326,219 B2
(45) Date of Patent: May 10, 2022

(54) GRAIN-ORIENTED ELECTROMAGNETIC STEEL SHEET AND METHOD FOR PRODUCING GRAIN-ORIENTED ELECTROMAGNETIC STEEL SHEET

(71) Applicant: JFE Steel Corporation, Tokyo (JP)

(72) Inventors: Shigehiro Takajo, Tokyo (JP); Takumi Umada, Tokyo (JP); Takashi Terashima, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 5 days.

(21) Appl. No.: 16/342,879

(22) PCT Filed: Oct. 17, 2017

(86) PCT No.: PCT/JP2017/037588
§ 371 (c)(1),
(2) Date: Apr. 17, 2019

(87) PCT Pub. No.: WO2018/074486
PCT Pub. Date: Apr. 26, 2018

(65) Prior Publication Data
US 2020/0056256 A1   Feb. 20, 2020

(30) Foreign Application Priority Data

Oct. 18, 2016   (JP) .............................. JP2016-204244

(51) Int. Cl.
*C21D 8/12* (2006.01)
*C21D 8/02* (2006.01)
(Continued)

(52) U.S. Cl.
CPC ......... *C21D 8/1288* (2013.01); *C21D 8/0205* (2013.01); *C21D 8/0226* (2013.01);
(Continued)

(58) Field of Classification Search
CPC ............................ C21D 8/1288; C21D 8/0205
(Continued)

(56) References Cited

U.S. PATENT DOCUMENTS 3,932,236 A   1/1976   Wada et al.
4,698,272 A   10/1987   Inokuti et al.
(Continued)

FOREIGN PATENT DOCUMENTS

CN   1048554 A     1/1991
CN   101443479 A   5/2009
(Continued)

OTHER PUBLICATIONS

International Search Report and Written Opinion for International Application No. PCT/JP2017/037588, dated Nov. 21, 2017, 6 pages.
(Continued)

*Primary Examiner* — Weiping Zhu
(74) *Attorney, Agent, or Firm* — RatnerPrestia

(57) ABSTRACT

Provided are: a grain-oriented electromagnetic steel sheet exhibiting excellent coating film adhesion and excellent magnetic characteristics; and a method for producing this grain-oriented electromagnetic steel sheet. This grain-oriented electromagnetic steel sheet is provided with a ceramic coating film arranged on a steel sheet, and an oxide insulating tension coating film arranged on the ceramic coating film. The ceramic coating film contains a nitride and an oxide; the nitride contains at least one element selected from the group consisting of Cr, Ti, Zr, Mo, Nb, Si, Al, Ta, Hf, W and Y; and the oxide has a corundum crystal structure. The Young's modulus of the ceramic coating film as determined by a nanoindentation method is 230 GPa or more; the average film thickness of the ceramic coating film is from 0.01 μm to 0.30 μm (inclusive); and the tension of the oxide insulating tension coating film is 10 MPa or more.

21 Claims, 3 Drawing Sheets

(51) Int. Cl.
*C23C 14/06* (2006.01)
*C23C 14/32* (2006.01)
*C23C 28/04* (2006.01)
*H01F 1/147* (2006.01)
*H01F 1/153* (2006.01)

(52) U.S. Cl.
CPC ......... *C21D 8/0236* (2013.01); *C21D 8/1283* (2013.01); *C23C 14/0641* (2013.01); *C23C 14/325* (2013.01); *C23C 28/042* (2013.01); *H01F 1/14716* (2013.01); *H01F 1/15383* (2013.01); *C21D 2201/05* (2013.01)

(58) Field of Classification Search
USPC ........................................................ 148/222
See application file for complete search history.

(56) References Cited

U.S. PATENT DOCUMENTS

| | | | |
|---|---|---|---|
| 4,713,123 | A | 12/1987 | Inokuti et al. |
| 5,174,833 | A | 12/1992 | Tanaka et al. |
| 6,287,703 | B1 * | 9/2001 | Inokuti ................ C21D 8/1277 148/307 |
| 2009/0233114 | A1 | 9/2009 | Takeda et al. |
| 2013/0140952 | A1 | 6/2013 | Kamijo et al. |
| 2014/0245926 | A1 | 9/2014 | Muraki et al. |
| 2018/0119244 | A1 | 5/2018 | Omura et al. |

FOREIGN PATENT DOCUMENTS

| | | |
|---|---|---|
| EP | 0971374 A1 | 1/2000 |
| JP | 5224499 B2 | 7/1977 |
| JP | S61235514 A | 10/1986 |
| JP | 6354767 B2 | 10/1988 |
| JP | 2004027345 A | 1/2004 |
| JP | 2005240157 A | 9/2005 |
| JP | 2005264236 A | 9/2005 |
| JP | 4192818 B2 | 12/2008 |
| JP | 2013121191 A | 6/2013 |
| JP | 2015118200 A | 6/2015 |
| WO | 2016125504 A1 | 8/2016 |

OTHER PUBLICATIONS

Japanese Office Action for Japanese Application No. 2018-505748, dated Nov. 13, 2018 with Office Action, 6 pages.
Korean Office Action for Korean Application No. 10-2019-7010118, dated Aug. 10, 2020, with Office Action, 6 pages.
Chinese Office Action with Search Report for Chinese Application No. 201780062699.6, dated Jun. 28, 2020, 8 pages.
Extended European Search Report for European Application No. 17 862 005.0, dated Jun. 5, 2019, 7 pages.

* cited by examiner

GRAIN-ORIENTED ELECTROMAGNETIC STEEL SHEET AND METHOD FOR PRODUCING GRAIN-ORIENTED ELECTROMAGNETIC STEEL SHEET

CROSS REFERENCE TO RELATED APPLICATIONS

This is the U.S. National Phase Application of PCT/JP2017/037588, filed Oct. 17, 2017, which claims priority to Japanese Patent Application No. 2016-204244, filed Oct. 18, 2016, the disclosures of each of these applications being incorporated herein by reference in their entireties for all purposes.

FIELD OF THE INVENTION

The present invention relates to a grain oriented electrical steel sheet and a producing method of a grain oriented electrical steel sheet.

BACKGROUND OF THE INVENTION

Grain oriented electrical steel sheets are used as a material for an iron core disposed in a transformer and have been required to show low iron loss for enhancing energy use efficiency of a transformer.

To achieve low iron loss of a grain oriented electrical steel sheet, there are known methods such as, in addition to sharpening crystal grains to the Goss orientation, increasing coating tension, and thinning, a method involving surface processing of a steel sheet.

Aside from that, for instance, Patent Literature 1 describes that smoothing a steel sheet surface brings about excellent magnetic properties. While the specific mechanism thereof is still unclear in many respects, this phenomenon occurs probably because, owing to a decrease in steel sheet surface roughness, energy loss associated with domain wall motion is suppressed, which leads to reduced hysteresis loss, thus increasing the magnetic permeability. For instance, it is possible to achieve a magnetic flux density $B_8$ of up to 1.96T or thereabout.

In the case of employing this method, however, while hysteresis loss which is a part of the total iron loss is reduced, eddy current loss is not sufficiently reduced.

Meanwhile, it is known that, when a tensile stress is applied to a steel sheet, eddy current loss can be reduced more compared to the case where a tensile stress of the same magnitude is applied to a steel sheet with a high roughness.

In addition, when a still higher tensile stress is applied, much lower iron loss than that in conventional cases can be achieved. Accordingly, a high tension coating has been developed in order to impart high tension to a steel sheet having a smoothed surface.

Conventionally, a phosphate-based high tension coating formed by baking an inorganic treatment solution has been known. Even when, however, an attempt is made to form such a high tension coating on a steel sheet having a smoothed surface, the coating sometimes does not adhere well. This happens probably because a phosphate-based high tension coating has a lower coefficient of thermal expansion than that of a steel sheet, and therefore, even though formed by baking at high temperature, the coating does not shrink in accordance with the shrinkage of the steel sheet during cooling and thus peels off.

It was discovered that one technique to form a high tension coating on a smoothed steel sheet is forming a ceramic coating such as a TiN coating, and it has been disclosed that methods such as PVD (Physical Vapor Deposition) methods or CVD (Chemical Vapor Deposition) methods are applicable (see, for instance, Patent Literature 2).

PATENT LITERATURES

Patent Literature 1: JP 52-24499 B
Patent Literature 2: JP 4192818 B

SUMMARY OF THE INVENTION

Formation of a ceramic coating has the following problems.

One problem is that the cost for coating formation would be high. In coating formation through a PVD or CVD method, the cost of metal element serving as an evaporation source (e.g., Ti in the case of forming a TiN coating) is high while a coating formation yield is low, and thus, the coating formation cost increases with increasing amount of coating formation.

Accordingly, it is desired to make a ceramic coating as thin as possible, which, in turn, makes it difficult to achieve low iron loss.

Another problem is related to workability. Ceramic coatings as above typically have high hardness, so that a shearing machine is severely worn through a shear process for cutting out a material having a bevel edge for an iron core of a transformer from a steel sheet, resulting in low productivity. In addition, when work is carried/out with a worn shearing machine, burrs and the like are formed on an iron core material, which may impair the characteristics of a transformer.

Results of experiments conducted by the present inventors, however, showed that the Young's modulus is liable to decrease with decreasing hardness of a ceramic coating. The hardness of a ceramic coating presumably depends on how much deficiency or the like is present in the coating, and it is easily inferable that a larger amount of deficiency leads to lower hardness and a lower Young's modulus. The Young's modulus of a coating should be proportional to the magnitude of tension imparted to a steel sheet, and therefore, a decrease in Young's modulus is unfavorable in principle from the aspect of iron loss.

In connection with the foregoing problems, the present inventors discussed how to achieve both an effect to impart high tension to a steel sheet and high heat resistance, while making a ceramic coating thin to a maximum extent. When a ceramic coating is thin, the amount of ceramic coating to be broken in shearing is small accordingly, thus improving workability.

Specifically, the present inventors studied a new coating structure. To be more specific, a ceramic coating on a steel sheet is made as thin as possible; since this configuration reduces the ceramic coating's effect to impart tension to the steel sheet, a tensile insulation coating is formed on the ceramic coating in order to make up for, the reduced effect. The tensile insulation coating herein is a phosphate-based, insulation tension oxide coating that is formed by baking an inorganic treatment solution at lower cost than the cost for forming a ceramic coating.

The present inventors have made an intensive study and as a result found that the foregoing coating structure has the following problems.

First, even when the insulation tension oxide coating is formed on an ultrathin ceramic coating under known conditions, high tension is sometimes not imparted to a steel sheet. In this case, excellent magnetic properties such as low iron loss cannot be attained.

In addition, after annealing such as stress relief annealing, a ceramic coating sometimes peels off. In other words, a coating adhesion property after annealing sometimes becomes poor. This phenomenon is notably seen when a ceramic coating is thin.

The present invention has been made in view of the above and aims at providing a grain oriented electrical steel sheet having excellent coating adhesion property and magnetic properties, as well as a producing method thereof.

The present inventors found, through an earnest study, that employing the configuration described below enables to achieve the foregoing objects. The invention has been thus completed.

Specifically, the present invention according to exemplary embodiments provides the following [1] to [7].

[1] A grain oriented electrical steel sheet comprising a steel sheet, a ceramic coating disposed on the steel sheet, and an insulation tension oxide coating disposed on the ceramic coating,
- wherein the ceramic coating includes a nitride and an oxide,
- wherein the nitride contains at least one element selected from the group consisting of elements of Cr, Ti, Zr, Mo, Nb, Si, Al, Ta, Hf, W and Y,
- wherein the oxide has a corundum type crystal structure,
- wherein a Young's modulus of the ceramic coating measured by a nanoindentation method is not less than 230 GPa,
- wherein the ceramic coating has an average coating thickness of not less than 0.01 µm but not more than 0.30 µm, and
- wherein the insulation tension oxide coating has a tension of not less than 10 MPa.

[2] The grain oriented electrical steel sheet according to [1] above,
- wherein the ceramic coating contains the oxide in its surface layer on the insulation tension oxide coating side.

[3] The grain oriented electrical steel sheet according to [1] or [2] above,
- wherein the nitride has a crystal structure of cubic crystal system.

[4] The grain oriented electrical steel sheet according to any one of [1] to [3] above,
- wherein the nitride contains two or more of the elements.

[5] The grain oriented electrical steel sheet according to any one of [1] to [4] above,
- wherein a crystal orientation of the nitride accumulates in one of orientations {111}, {100} and {110}.

[6] A method of producing the grain oriented electrical steel sheet according to any one of [1] to [5] above,
- wherein the ceramic coating is formed by an ark ion plating method.

[7] The method of producing the grain oriented electrical steel sheet according to [6] above,
- wherein a roll coater is used in formation of the insulation tension oxide coating.

The present invention can provide a grain oriented electrical steel sheet having excellent coating adhesion property and magnetic properties, as well as a producing method thereof.

DETAILED DESCRIPTION OF EMBODIMENTS OF THE INVENTION

Findings Obtained by Inventors

Figure 1:
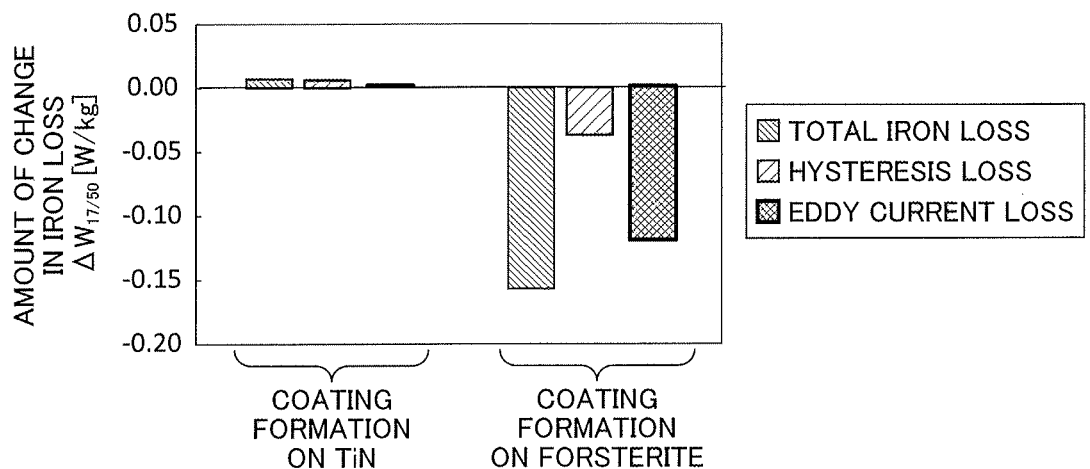
FIG. 1 is a graph showing the amount of change in iron loss after formation of an insulation tension oxide coating relative to before the formation.

FIG. 1 is a graph showing the amount of change in iron loss after formation of an insulation tension oxide coating relative to before the formation. To be more specific, a material was prepared by forming a TiN coating of 0.20 µm on a smoothed steel sheet by a PVD method, namely, an ion plating HCD (Hollow Cathode Discharge) method; and another material being an intermediate product of a conventional grain oriented electrical steel sheet was prepared by forming a forsterite coating on a steel sheet. The thus-prepared materials were each applied with a treatment solution by roll coating and baked at 820° C., thereby forming a phosphate-based, insulation tension oxide coating. A value obtained by subtracting an iron loss $W_{17/50}$ before coating formation from an iron loss $W_{17/50}$ after coating formation was defined as the amount of iron loss change $\Delta W_{17/50}$ (unit: W/kg).

As shown in the graph of FIG. 1, when the insulation tension oxide coating was formed on the forsterite coating, the iron loss reduced by about 0.15 W/kg, while when the same was formed on TiN, there was no iron loss reduction effect, and rather, the iron loss increased. Details of eddy current loss and hysteresis loss in the iron loss (total iron loss) were examined, and it was found that, when the coating was formed on TiN, neither the eddy current loss nor the hysteresis loss reduced.

To study this phenomenon, the present inventors conducted additional experiments and obtained the following findings 1) to 4) in relation to the insulation tension oxide coating baked on TiN.

1) Through observation of a surface with an SEM (Scanning Electron Microscope), many holes with diameters of several micrometers, which appeared to be air bubbles, were seen in the insulation tension oxide coating immediately after baking. The presence of the holes probably led to a smaller tension imparting effect of the insulation tension oxide coating.

2) Through thin coating X-ray diffraction, crystals considered to be a Ti oxide and an iron phosphide were observed in the insulation tension oxide coating. These crystals were not observed before the insulation tension oxide coating was formed.

3) In the evaluation of coating adhesion property by a round bar winding method, the coating adhesion property of a ceramic coating deteriorated after the insulation tension oxide coating was formed than that before the insulation tension oxide coating was formed. This occurred probably because formation of a Ti oxide and an iron phosphide as described above exerted some kind of influence on the ceramic coating, thus impairing the coating adhesion property.

4) When a steel sheet having a TiN coating of 0.20 μm formed thereon was annealed in an Ar atmosphere with a heating pattern used for baking the insulation tension oxide coating without forming the insulation tension oxide coating, the degrees of increase in iron loss and decrease in coating adhesion property were smaller than those when the insulation tension oxide coating was formed. It was assumed from the foregoing result that increase in iron loss and deterioration of coating adhesion property due to formation of the insulation tension oxide coating were mainly caused by a reaction between the insulation tension oxide coating and the TiN coating. Furthermore, it was assumed that the above phenomenon occurred probably because a reaction between phosphoric acid (coating) and TiN in the insulation tension oxide coating and iron caused generation of a Ti oxide, an iron phosphide and nitrogen.

From the foregoing results, the present inventors considered that if the reaction between the insulation tension oxide coating and the TiN coating can be suppressed, it should be possible to allow the insulation tension oxide coating to have an excellent tension imparting effect as well as an excellent adhesion property, and accordingly considered changing the composition of a ceramic coating.

Various PVD methods are known, such as vapor deposition, sputtering and ion plating. When the HCD method that is one ion plating method heretofore widely used is employed, the types of formable coatings are limited to TiN, CrN and the like. Meanwhile, it is known that when the sputtering method is employed, an AlN coating and other various oxide coatings can be formed. In recent years, the use of such techniques as an AIP (Ark Ion Plating) method which is one ion plating method, the sputtering method and the like has enabled formation of ceramic coatings containing a plurality of metals, such as TiAlN and AlCrN. In experiments described below, nitride coatings were formed by the AIP method, while oxide coatings were formed by the sputtering method.

Figure 2:
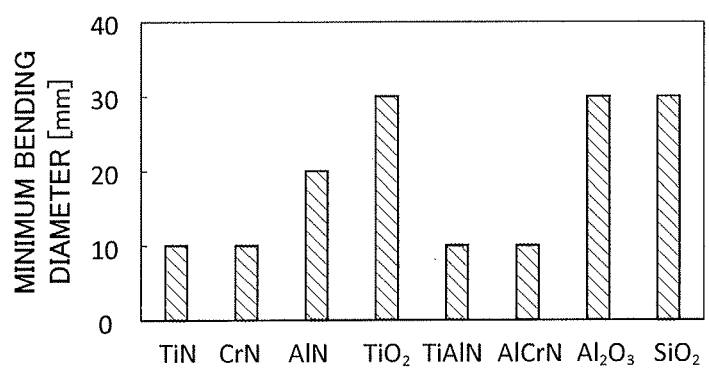
FIG. 2 is a graph showing evaluation results of the coating adhesion property of ceramic coatings as determined through a round bar winding method.

FIG. 2 is a graph showing evaluation results of the coating adhesion property of ceramic coatings as determined through a round bar winding method. To be more specific, nitride coatings shown in FIG. 2 were formed by the AIP method, while oxide coatings were formed by the sputtering method, and their coating adhesion properties were evaluated by the round bar winding method.

The round bar winding method is as follows: A steel sheet of 30 mm width×280 mm length in the rolling direction is wound around a round bar having a diameter of several tens of millimeters, whereby an internal stress arises inside the steel sheet; then, whether or not a crack occurs in a coating is examined, and the thinnest round bar among round bars with which no crack occurs is defined as an index for evaluating the adhesion. When the minimum bending diameter is not more than 10 mm, the evaluation value of bending diameter is to be 10 mm.

The results shown in the graph of FIG. 2 revealed that the nitride coatings were more excellent in adhesion than the oxide coatings.

Generally, nitrides are easily oxidized; therefore, when a nitride coating is formed by, for instance, a PVD method, it should be difficult to suppress a reaction including generation of an oxide during high temperature annealing. Based on this assumption, the present inventors considered that, by reducing the rate of reaction between a ceramic coating made of a nitride and the insulation tension oxide coating to the minimum, the deterioration of iron loss reduction effect and coating adhesion property can be suppressed.

Figure 3:
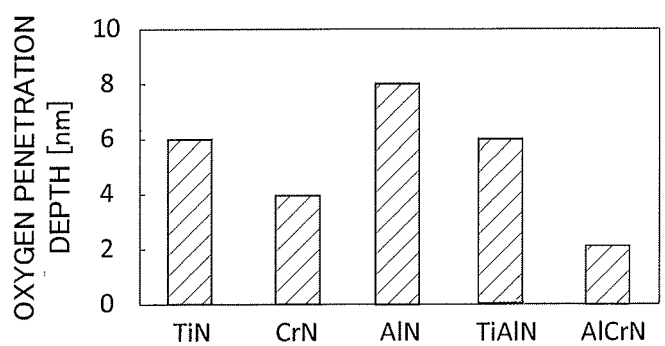
FIG. 3 is a graph showing the oxygen penetration depths in ceramic coatings.

FIG. 3 is a graph showing the oxygen penetration depths in ceramic coatings. To be more specific, steel sheets on which various ceramic coatings had been formed by the AIP method were held in the atmosphere at 800° C. for 5 minutes, whereafter the oxygen concentration profile of each was measured by AES (Auger Electron Spectroscopy) in a depth direction of the associated ceramic coating from its surface. The depth at which the detected oxygen concentration was 5% with respect to the detected nitrogen concentration was defined as the oxygen penetration depth (unit: nm).

The results shown in the graph of FIG. 3 revealed that when a ceramic coating of CrN or AlCrN was formed, the oxygen penetration depth was relatively small.

At this timing, an oxide generated in a ceramic coating after annealing (which simulated stress relief annealing) in which a steel sheet was held in a nitrogen atmosphere at 820° C. for 3 hours was observed by an X-ray diffraction method.

The observation revealed that TiO, $TiO_2$ or $Ti_2O_3$ of cubic crystal system was generated in TiN, $Cr_2O_3$ (of corundum type) in CrN, $Al_2O_3$ (mainly of cubic crystal system) in AlN, $TiO_2$ (of cubic crystal system) in TiAlN, and $Al_2O_3$ (mainly of corundum type) in AlCrN. Diffraction peaks of $Cr_2O_3$ and $Al_2O_3$ were extremely lower than those of the others.

It was assumed from the foregoing results that when an oxide of corundum type was formed in a surface layer of a nitride coating on the insulation tension oxide coating side, the insulation tension oxide coating and the nitride coating were physically isolated from each other, thus preventing oxidization of the nitride coating from further progressing.

Figure 4:
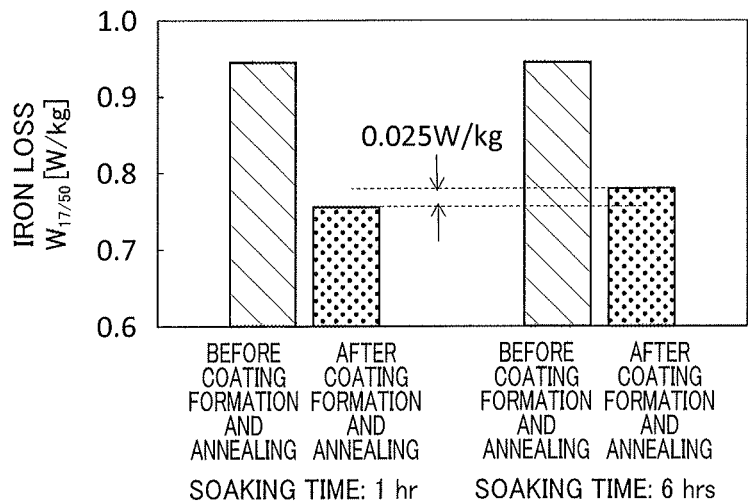
FIG. 4 is a graph showing iron losses after coating formation and annealing (1 hour and 6 hours) relative to before those processes.

FIG. 4 is a graph showing iron losses after coating formation and annealing (1 hour and 6 hours) relative to before those processes. To be more specific, first, the iron loss $W_{17/50}$ (unit: W/kg) of a 0.2 mm-thick grain oriented electrical steel sheet having a smoothed surface was measured. Next, an AlCrN coating of 0.10 μm was formed on this grain oriented electrical steel sheet by the AIP method, and the insulation tension oxide coating was formed thereon. Subsequently, the resulting grain oriented electrical steel sheet was soaked in a nitrogen atmosphere at 820° C. for 1 hour or 6 hours to simulate stress relief annealing, and the iron loss $W_{17/50}$ (unit: W/kg) of the steel sheet was measured.

As shown in the graph of FIG. 4, the final iron loss with 6-hour annealing was larger than that with 1-hour annealing. The surface of the insulation tension oxide coating was observed with an SEM, and as a result more holes with a diameter of several micrometers, which appeared to be air bubbles, were seen in the coating having undergone 6-hour annealing. It is assumed from the foregoing results that in 6-hour annealing, further progress of reaction between the AlCrN coating and the insulation tension oxide coating led to a less tension imparting effect of the insulation tension oxide coating.

Figure 5:
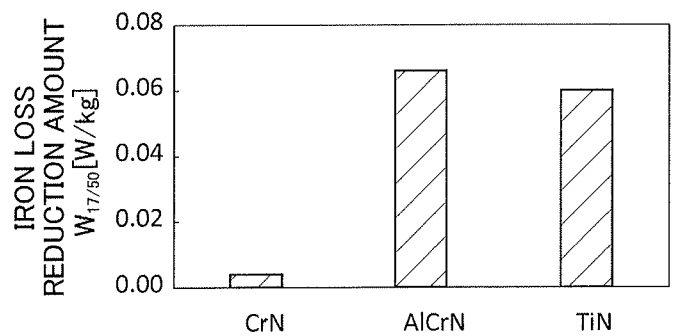
FIG. 5 is a graph showing the iron loss reduction amounts when ceramic coatings are formed.

FIG. 5 is a graph showing iron loss reduction amounts when ceramic coatings are formed. To be more specific, a ceramic coating of AlCrN, CrN or TiN (coating thickness: 0.10 μm) was formed by the AIP method, and the iron loss reduction amount was obtained.

As shown in the graph of FIG. 5, despite a coating thickness of only 0.10 μm, the iron loss remarkably reduced in the case where the AlCrN coating was formed compared to the case where the CrN coating was formed.

Since the crystal lattice constant and the Young's modulus should be physical properties of a ceramic coating that influence the iron loss reduction amount, those properties were measured.

When d values corresponding to the {220} crystal plane of the ceramic coatings were obtained by the X-ray diffraction method, the results were "1.4568 Å" for the AlCrN coating, "1.4755 Å" for the CrN coating, and "1.5074 Å" for the TiN coating.

The Young's moduli of the ceramic coatings were obtained by a nanoindentation method, and the results were "330 GPa" for the AlCrN coating, "260 GPa" for the CrN coating, and "302 GPa" for the TiN coating.

Figure 6:
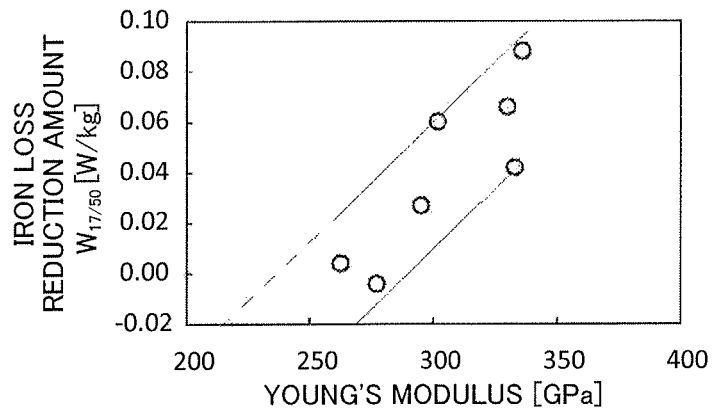
FIG. 6 is a graph showing the relationship between the Young's modulus of a ceramic coating and the iron loss reduction amount.

FIG. 6 is a graph showing the relationship between the Young's modulus of a ceramic coating and the iron loss reduction amount. To be more specific, various ceramic coatings were formed by the AIP method, the Young's moduli (unit: GPa) of the ceramic coatings were obtained by the nanoindentation method, and the iron loss reduction amounts were obtained.

As the ceramic coatings, in addition to three types of (AlCrN, CrN and TiN) ceramic coatings, TiCN, TiAlN and TiCrN ceramic coatings were formed, and a TiN ceramic coating was also formed with different bias voltage (Young's modulus: 333 GPa).

As shown in the graph of FIG. 6, a tendency was seen in which the iron loss reduction amount increased with increasing Young's modulus of a ceramic coating. Although the mechanism thereof is not clear, it is assumed that as the Young's modules is larger, tensile deformation of a steel sheet occurs more easily upon formation of a ceramic coating, and thus a tensile residual stress is generated.

As described above, the present inventors found that when a nitride coating is formed as an ultrathin ceramic coating and the insulation tension oxide coating is formed thereon by baking at high temperature, if an oxide of corundum type is formed in the ceramic coating, the insulation tension oxide coating retains its excellent tension imparting effect even after baking.

To further increase the iron loss reduction effect and enhance the coating adhesion property, it is important to not only simply oxidize a nitride to form an oxide in a ceramic coating but also maintain an unoxidized nitride in the vicinity of the surface of the ceramic coating on the steel sheet side.

Utilizing baking of the insulation tension oxide coating to oxidize a nitride coating is also an unprecedented method.

[Grain Oriented Electrical Steel Sheet and Producing Method Thereof]

Again, the grain oriented electrical steel sheet of according to embodiments of the invention is described below.

The grain oriented electrical steel sheet according to embodiments of the invention is a grain oriented electrical steel sheet comprising a steel sheet, a ceramic coating disposed on the steel sheet, and an insulation tension oxide coating disposed on the ceramic coating, wherein: the ceramic coating includes a nitride and an oxide; the nitride contains at least one element selected from the group consisting of Cr, Ti, Zr, Mo, Nb, Si, Al, Ta, Hf, W and Y; the oxide has a corundum type crystal structure; the Young's modulus of the ceramic coating measured by the nanoindentation method is not less than 230 GPa; the ceramic coating has an average coating thickness of not less than 0.01 μm but not more than 0.30 μm; and the insulation tension oxide coating has a tension of not less than 10 MPa.

The grain oriented electrical steel sheet of the invention is excellent in magnetic properties such as iron loss, as well as coating adhesion property.

The following description also covers the producing method of a grain oriented electrical steel sheet according to embodiments of the present invention.

<Steel Sheet>

Preferable examples of a steel sheet used in the present invention include: a steel sheet obtained by removing a forsterite coating from a grain oriented electrical steel sheet having a forsterite coating (steel sheet after secondary recrystallization) (embodiment A); and a grain oriented electrical steel sheet produced with no forsterite coating having been formed (embodiment B).

In either of the embodiments, a steel sheet surface on which a ceramic coating is to be formed is preferably smooth and more preferably free from impurities such as oxides as much as possible.

The method of producing a grain oriented electrical steel sheet having a forsterite coating is not particularly limited, and conventionally known methods may be used. Specifically, for instance, an ingot having a predetermined steel composition is subjected to hot rolling and then a few times (e.g., at most two times) of cold rolling with several times of annealing performed therebetween, to thereby obtain a final cold rolled steel sheet, which is in turn subjected to decarburization annealing and finishing annealing to allow secondary recrystallized grains having the Goss orientation to develop. Thus, the grain oriented electrical steel sheet having a forsterite coating (steel sheet after secondary recrystallization) is obtained.

In the case of the embodiment A, a forsterite coating may be removed by a conventionally known method, and exemplary methods that may be applied include mechanical polishing, chemical polishing and electrolytic polishing.

In mechanical polishing, a strain is introduced in a steel sheet by polishing, and therefore, it is preferable to additionally perform chemical polishing after the mechanical polishing for the purpose of removing the strain.

In chemical polishing, a mixture of hydrochloric acid and hydrogen fluoride, nitric acid, and/or a mixed aqueous solution of an aqueous hydrogen fluoride solution and an aqueous hydrogen peroxide solution may be used for example, and a forsterite coating and a steel sheet can be simultaneously polished.

In electrolytic polishing, an aqueous solution of NaCl may be used as the electrolytic solution, for example.

After polishing, the arithmetic mean roughness Ra of the steel sheet surface is preferably up to 0.3 μm and more preferably up to 0.1 μm. Since, however, excessive polishing may result in low yield of steel sheets, the amount of polishing of a steel sheet after the forsterite coating is removed is preferably up to 5% of the steel sheet before polishing.

Also in the case of the embodiment B, inevitable impurities may be formed on a steel sheet surface during secondary recrystallization annealing or the like, and therefore, the top and bottom surface layers of the steel sheet are each preferably removed by about several micrometers. In this case, since the amount of polishing is small, it, is difficult to adjust the Ra value; therefore, it is preferable to perform adjustment to achieve a desired roughness by, for example, reducing a roll roughness in a rolling process in advance.

The steel sheet preferably has a steel composition including, in percentage by mass, C in an amount of 30 ppm or less (0.003% or less), Si in an amount from 1% to 7%, P in an amount of 0.1% or less, Mn in an amount of 0.1% or less, S in an amount of less than 10 ppm (less than 0.001%) and N in an amount of 20 ppm or less (0.002% or less).

When C is excessively contained, the iron loss may increase due to magnetic aging, so that the C content is preferably 30 ppm or less.

Si is preferably contained in an amount of 1% or more in order to increase the specific resistance and thereby reduce the iron loss, but the excessive Si content may impair productivity and therefore, the Si content is preferably 7% or less.

P may be contained because it serves to increase the specific resistance; however, the presence of P may decrease the saturation flux density while decreasing productivity. Therefore, the P content is preferably 0.1% or less.

When Mn and S are excessively contained, a precipitate such as MnS may be formed and act to worsen the iron loss. Therefore, the Mn content and the S content are preferably 0.1% or less and less than 10 ppm, respectively.

When N is contained, a silicon nitride or the like may be deposited in stress relief annealing and act to deteriorate the iron loss. Therefore, it is preferable to reduce the N content as much as possible.

Other components may be added to sharpen the crystal orientation after secondary recrystallization to the Goss orientation based on conventional findings; however, in the case of forming a forsterite coating, since Cr acts to develop the anchor effect, the Cr content is preferably as small as possible and more preferably 0.1% or less.

Ti, Nb, V, Zr and Ta may form a carbide or a nitride and thus act to worsen the iron loss; therefore, they are preferably contained in an amount of 0.01% or less in total.

The steel sheet preferably has the crystallographic texture with crystal orientations accumulating in the vicinity of the Goss orientation. In the average crystal orientation, β that is an angle formed between the <100> axis of secondary recrystallized grains extending in a rolling direction of a steel sheet and a rolled surface thereof is preferably up to 3°. This is because when the β angle is small, the iron loss reduction effect remarkably increases. An α angle is preferably up to 4°.

In particular, when a steel sheet surface is not subjected to magnetic domain refining that involves forming a groove or locally introducing a strain using a laser or electron beam or the like, the average β angle is more preferably not less than 1° but not more than 3°. This is because when the β angle is close to 0°, the eddy current loss remarkably increases.

The steel sheet preferably has an average grain size of 5 mm or more. When the average grain size is too small, although the eddy current loss decreases, the hysteresis loss increases more than that, and thus, this is disadvantageous in terms of the total iron loss.

The steel sheet preferably has a sheet thickness from 0.10 to 0.30 mm because while the iron loss reduction effect produced through formation of the insulation tension oxide coating increases with thinner sheet thickness, an excessively thin sheet thickness makes it difficult to achieve a desired β angle.

<Treatment Before Formation of Ceramic Coating>

It is preferable that visibly recognizable rust be not present on the steel sheet surface on which a ceramic coating is to be formed. When rust is visibly recognized, the rust is preferably removed by pickling using hydrochloric acid, nitric acid or other acid.

Since, however, a micro-size oxide is inevitably formed on the steel sheet surface, it is preferably removed by ion cleaning in a vacuum at 10 Pa or lower before a ceramic coating is formed. Ion cleaning is carried out by, for example, applying negative bias voltage of not higher than −300 V to the steel sheet to accelerate ions and cause the accelerated ions to collide against the steel sheet for at least 10 seconds. The bias voltage is preferably not higher than −500 V and more preferably not higher than −800 V. With this bias voltage, kinetic energy of ions increases whereby a cleaning ability increases, thereby shortening a necessary time and improving productivity. On the other hand, when the bias voltage is excessively low, a strain is provided to the steel sheet and this may lead to increased iron loss; therefore, the lower limit of the bias voltage is preferably −2000 V.

The cleaning time is preferably up to 5 minutes and more preferably up to 2 minutes.

<Ceramic Coating>

The grain oriented electrical steel sheet according to embodiments of the invention has, on the steel sheet as above, a ceramic coating containing a nitride and an oxide.

For the ceramic coating, the following two embodiments are preferably employed, for example.

Embodiment 1

A nitride coating is formed as a ceramic coating, and subsequently, part of the nitride is oxidized to form an oxide upon baking for forming the insulation tension oxide coating, which will be described later; thus, the ceramic coating contains an oxide in addition to a nitride.

Embodiment 2

A ceramic coating contains both a nitride and an oxide from the beginning (before the insulation tension oxide coating is formed).

In either of the embodiments, an oxide in the ceramic coating has a corundum type crystal structure. With this configuration, even when the grain oriented electrical steel sheet according to embodiments of the invention is further subjected to annealing such as stress relief annealing, the ceramic coating (i.e., a nitride therein) is prevented from being further oxidized, and a reaction between the ceramic coating and the insulation tension oxide coating is suppressed, so that the insulation tension oxide coating can have an excellent tension imparting effect, thereby achieving low iron loss and excellent coating adhesion property.

In the case of the embodiment 1 above, it is preferable that only a surface layer (a region from the surface to a thickness of up to 10 nm) in the ceramic coating on the insulation tension oxide coating side be oxidized in order to achieve further excellent magnetic properties and coating adhesion property. In this case, the surface of the ceramic coating on the steel sheet side is not oxidized and has a nitride.

«Nitride»

A nitride contained in the ceramic coating includes at least one element selected from the group consisting of Cr, Ti, Zr, Mo, Nb, Si, Al, Ta, Hf, W and Y.

Specific examples of the nitride include AlCrN, CrN, TiN, TiCN, TiAlN and TiCrN. In particular, a nitride including at least one element selected from the group consisting of Al and Cr is preferred, as exemplified by AlCrN and CrN.

The nitride in the ceramic coating may include two or more of the above elements and may be a solid solution.

When the nitride in the ceramic coating is for example AlCrN, the composition ratio between Al and Cr need not be 50:50, and AlCrN may take on the form in which Cr in an amount of several percents to several tens of percents is solved in AlN. One example is $Al_{0.7}Cr_{0.3}N$. In the present description, such an embodiment is also referred to as "AlCrN" for convenience.

To increase the Young's modulus of the ceramic coating, Si or the like in an amount of up to several percents may be solved in AlCrN. Hereinafter, this is also referred to as "AlSiCrN" for convenience.

The nitride in the ceramic coating preferably has a crystal structure of cubic crystal system (rock salt type). For instance, the hexagonal crystal system and the cubic crystal system (rock salt type) are known as the crystal structure of AlN. In the case of cubic crystal system, an oxide generated upon oxidization of a nitride tends to be of corundum type with a higher Young's modulus.

In the case of the embodiment 1 above, the ceramic coating before the insulation tension oxide coating is formed contains the nitride in an amount of preferably not less than 85 mass % and more preferably not less than 95 mass %, and is even more preferably constituted of virtually the nitride only.

«Oxide»

As described above, the oxide in the ceramic coating has a corundum type crystal structure. The fact that the oxide in the ceramic coating has a corundum type crystal structure can be observed by, for instance, an electron diffraction method.

The type of element included in the oxide in the ceramic coating is not particularly limited; however, in the case of the embodiment 1 above, the oxide is generated upon oxidization of a nitride and therefore includes the same element as that included in the nitride.

The oxide content of the ceramic coating is not particularly limited. For example, the total amount of the oxide and the nitride described above is preferably not less than 85 mass % and more preferably not less than 95 mass % in the ceramic coating.

In the case of the embodiment 1 above, as described above, the ceramic coating preferably contains the oxide in its surface layer (a region from the surface to a thickness of up to 10 nm) on the insulation tension oxide coating side, and it is more preferable that the oxide be generated only within this surface layer.

«Young's Modulus»

The Young's modulus of the ceramic coating has a tendency in which a higher Young's modulus leads to a larger iron loss reduction amount as described above, and is therefore at least 230 GPa and preferably not less than 300 GPa. The upper limit thereof is not particularly limited and is for example not more than 500 GPa.

The Young's modulus of the ceramic coating is measured by the nanoindentation method. In this measurement, the Young's modulus ($E_{IT}$) is determined by the nanoindentation method using the following formula, with the ceramic coating used as a specimen having a Poisson's ratio (v) of 0.3.

$$\frac{1}{E_r} = \frac{(1-v^2)}{E_{IT}} + \frac{(1-v_i^2)}{E_i}$$ [Mathematical Formula 1]

$E_r$: Composite Young's modulus of the specimen and an indenter material (diamond)
$E_i$: Young's modulus of the indenter material (diamond) (=1141 GPa)
v: Poisson's ratio of the specimen
$v_i$: Poisson's ratio of the indenter material (diamond) (=0.070)

The Young's modulus of the ceramic coating can be measured after the insulation tension oxide coating is formed. In this case, the Young's modulus of the ceramic coating may be measured after the insulation tension oxide coating is removed as described later to have the ceramic coating exposed.

«Coating Thickness»

The ceramic coating has an average coating thickness of not less than 0.01 μm but not more than 0.30 μm.

To reduce the production cost, a smaller coating thickness is preferred, and the upper limit is set to be 0.30 μm.

On the other hand, an excessively small coating thickness results in deterioration of coating adhesion property of the insulation tension oxide coating, and therefore, the lower limit is set to be 0.01 μm. The average coating thickness is more preferably not less than 0.03 μm but not more than 0.10 μm.

In the present invention, the average coating thickness of the ceramic coating is determined as follows: A standard sheet having a previously known coating thickness in connection with each composition is used, coating thicknesses are measured with X-ray fluorescence at given three places, and the measurements are averaged.

«Crystal Orientation and Other Factors»

The crystal orientation of the nitride contained in the ceramic coating preferably accumulates in one of orientations {111}, {100} (same as {200}) and {110} (same as {220}).

Figure 7:
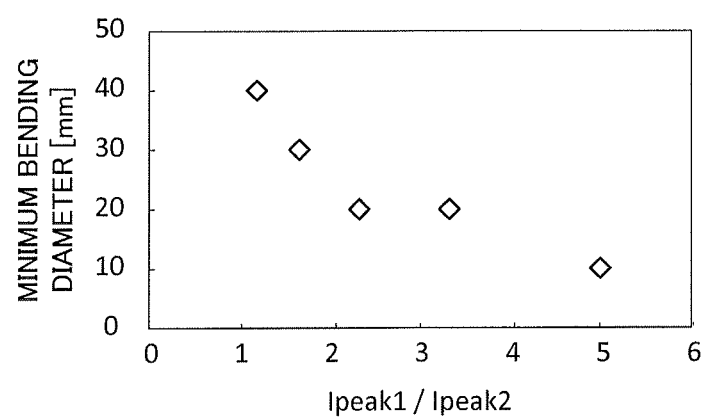
FIG. 7 is a graph showing the relationship between a minimum bending diameter, which is an index of coating adhesion property, and a diffraction intensity ratio (Ipeak1/Ipeak2) of a ceramic coating measured by an X-ray diffraction method.

FIG. 7 is a graph showing the relationship between a minimum bending diameter, which is an index of coating adhesion property, and a diffraction intensity ratio (Ipeak1/Ipeak2) of a ceramic coating measured by the X-ray diffraction method.

The ceramic coating herein was a CrN coating with a coating thickness of 0.10 μm formed by the AIP method under various bias voltage conditions. After the insulation tension oxide coating was formed and subsequently annealing was carried out in a nitride atmosphere at 800° C. for 30 minutes, the minimum bending diameter was measured.

Using the X-ray diffraction method, the intensities (CPS) of diffraction peaks corresponding to {111}, {200} and {220} of the CrN coating were measured; the maximum value among the measurements was defined as "Ipeak1," and the second maximum value as "Ipeak2." "Ipeak1/Ipeak2" was used as a simple index of a single orientation accumulation of the ceramic coating.

It can be seen from the graph of FIG. 7 that as the "Ipeak1/Ipeak2" value is larger, i.e., as the ceramic coating more closely accumulates in a single orientation, the minimum bending diameter is smaller, and the coating adhesion property is more excellent.

Considering the fact that conventional grain oriented electrical steel sheets have a minimum bending diameter of not more than 30 mm, it is preferable for the "Ipeak1/Ipeak2" value to be not less than 1.5. The producing method for achieving this is not particularly limited; when the coating is formed by the AIP method, the bias voltage for coating formation may appropriately be adjusted within a range from −50 to 500 V.

<Ceramic Coating Formation>

CVD or PVD methods or other methods are used for ceramic coating formation; however, for instance, a thermal CVD method uses a high coating formation temperature, so that coating texture tends to grow and be softened. Thus, PVD methods are preferably used.

While there are many types of PVD methods, a method involving ionizing a material in advance and then forming a coating on a target object, such as the AIP (Ark Ion Plating) method, is more preferred than other methods. This is because the method has a tendency to not only bring about a more excellent coating adhesion property than that in cases of using other methods but also allow the Young's modulus of the ceramic coating to increase through adjustment of the bias voltage.

The AIP method is generally described. First, metal to be vaporized (evaporation source) is taken as a cathode, while a vacuum chamber is taken as an anode. DC voltage is applied across the anode and the cathode from an ark power source to generate arc discharge. The activated cathode is heated to high temperature, vaporized and ionized. Thus-vaporized metal ions are also used for maintaining plasma. A substrate (e.g., a steel sheet) is applied with negative bias voltage and thereby attracts metal ions in plasma. When a coating of a nitride such as TiN is formed, nitrogen gas is introduced. The substrate is typically heated in order to improve adhesion between a formed coating and the substrate. Since the substrate is heated in vacuum, radiation heating, induction heating and the like are mainly used as the heating method.

The AIP method is advantageous in that, by using an alloy as a target (evaporation source), a composite nitride such as AlCrN can readily be formed. Thus, the AIP method is more preferably used in formation of an AlCrN coating and the like. It is preferable, however, to adjust a cathode so as not to allow a droplet to occur. A defect like occurrence of a droplet is not favorable because this may prompt diffusion of oxygen (O) from the insulation tension oxide coating, thereby causing transformation of the ceramic coating. To increase adhesion with a steel sheet, the rate of ionization of coating formation element is preferably set to 50% or more.

The coating formation temperature during formation of the ceramic coating is preferably not lower than 300° C. but not higher than 600° C. An excessively low coating formation temperature may lead to a decreased coating formation rate. On the other hand, when the coating formation temperature is excessively high, time and cost required for heating may be increased.

The rate of ceramic coating formation is preferably 0.3 nm/s or higher and more preferably 2.0 nm/s or higher. In the AIP method, the coating formation rate can be increased by increasing plasma energy or the evaporation source.

As described above, the AIP method involves applying negative bias voltage to a steel sheet to accelerate evaporation source ions and thereby cause the ions to collide against the steel sheet. At this time, the bias voltage is preferably up to −50 V. With this configuration, a ceramic coating formed is likely to have dense texture, thus achieving an excellent coating adhesion property. It is known that, as bias voltage is lower, crystals of a coating tend to accumulate in one direction; however, excessively low bias voltage may lead to remarkably low efficiency of coating formation, and therefore, the lower limit is preferably −500 V.

The flow rate of nitrogen gas required to form the ceramic coating of a nitride and the degree of vacuum in a coating formation chamber may suitably be selected from conventionally known values.

When a vacuum sheet passing apparatus is used, the apparatus preferably has a differential pressure structure with at least two stages. A steel sheet to be subjected to vapor deposition has moisture adsorbed thereon, and the above structure allows the moisture to be removed in a first-stage vacuum chamber. A three-stage differential pressure structure is more preferred. When moisture is present, defects may occur in the ceramic coating and lead to lower hardness, thus resulting in a lower coating adhesion property.

To stabilize the quality, the evaporation source (also referred to as "target") that is the source of the ceramic coating is positioned such that the ceramic coating can be uniformly formed over the entire steel sheet without unevenness.

The furnace length may be determined in advance so as to achieve a desired cleaning time, coating formation rate, and the like.

<Insulation Tension Oxide Coating>

The grain oriented electrical steel sheet according to embodiments of the invention has, on the ceramic coating as above, the insulation tension oxide coating. The insulation tension oxide coating is an oxide coating and also an insulation coating because the steel sheet is used as an iron core of a transformer.

The insulation tension oxide coating contains an oxide. This oxide is for instance derived from a phosphate included in a treatment solution to be described later, and one specific example thereof is silicon phosphate glass.

The insulation tension oxide coating contains such an oxide in an amount of preferably not less than 85 mass % and more preferably not less than 95 mass %, and is even more preferably constituted of virtually an oxide only.

«Tension»

The insulation tension oxide coating has a tension of at least 10 MPa.

The evaluation method (measurement method) of tension of the insulation tension oxide coating is as follows: First, the ceramic coating and the insulation tension oxide coating are formed in this order on each side of the steel sheet (having no forsterite coating), thus preparing a specimen (rolling direction, 280 mm; direction perpendicular to rolling direction, 30 mm) with no deflection. A corrosion protection tape is attached on the entire surface of one side of the prepared specimen. Subsequently, the specimen having the corrosion protection tape attached thereon is immersed in an aqueous sodium hydroxide solution at about 110° C. for about 10 minutes to thereby remove the insulation tension oxide coating on the side having no corrosion protection tape thereon. Since the steel sheet does not have the insulation tension oxide coating on one side, a curvature (deflection) of the steel sheet occurs in the sheet thickness direction-rolling direction plane. By removing the corrosion protection tape, the radius of curvature R of the steel sheet is determined. The tension σ of the insulation tension oxide coating is provided as the formula "$\sigma = Ed/3R$," where E is the Young's modulus of the steel sheet in the rolling direction, and d is the coating thickness of the coating on one side.

The upper limit of the tension of the insulation tension oxide coating is not particularly limited, and the tension of the insulation tension oxide coating is preferably 50 MPa or less, more preferably 40 MPa or less, and even more preferably 30 MPa or less.

«Coating Thickness»

The coating thickness of the insulation tension oxide coating on one side is preferably not less than 1.0 μm and more preferably not less than 2.0 μm because a high tension is easily obtainable.

In terms of the lamination factor, the coating thickness of the insulation tension oxide coating on one side is preferably not more than 10.0 μm and more preferably not more than 4.0 μm.

<Formation of Insulation Tension Oxide Coating>

The method of forming the insulation tension oxide coating is not particularly limited, and a formation method involving applying a treatment solution to be described later with a roll coater, followed by baking, is advantageous in terms of cost.

While baking is typically performed at a high temperature of at least 600° C., the yield point of the steel sheet decreases at this time, whereby an unnecessary strain may be introduced to the steel sheet due to line tension. To suppress this phenomenon, the baking temperature is set to 1000° C. or lower, and the line tension during baking is set to 20 MPa or less.

The atmosphere for baking is a nitrogen atmosphere, for instance.

When ion irradiation is performed at high accelerating voltage during formation of the ceramic coating, strains may slightly occur in the steel sheet. It is preferable to remove or reduce such strains through baking at a temperature of 750° C. or higher for at least 15 seconds.

A treatment solution used for formation of the insulation tension oxide coating preferably contains at least a phosphate. An exemplary metal type of the phosphate is at least one selected from the group consisting of Mg, Al, Ca, Sr, Fe, Cu, Mn and Zn. As the phosphate, a primary phosphate (biphosphate) is advantageously used from the viewpoint of availability.

The treatment solution preferably contains colloidal silica. The colloidal silica preferably has an average particle size from 5 to 200 nm. The colloidal silica content is preferably 50 to 150 parts by mass with respect to 100 parts by mass of the phosphate in terms of solid content.

The treatment solution may further contain chromic anhydride and/or bichromate, and the amount thereof is preferably 10 to 50 parts by mass with respect to 100 parts by mass of the phosphate in terms of solid content (dried product content).

Inorganic mineral particles such as silica powder or alumina powder may be further added to the treatment solution, and the amount thereof is preferably 0.1 to 10 parts by mass with respect to 100 parts by mass of the phosphate in terms of solid content.

<Magnetic Domain Refining>

Magnetic domain refining can be carried out by forming grooves in a surface of the steel sheet. In this case, if grooves are formed after the ceramic coating is formed, an additional cost is caused for removing the ceramic coating, and thus, grooves are preferably formed before the ceramic coating is formed.

When non-heat resistant type magnetic domain refining is performed by irradiation with an electron or laser beam, the refining is preferably carried out after the insulation tension oxide coating is formed. This is because some types of insulation tension oxide coatings are to be formed at high temperatures of 700° C. or higher, and if strains are introduced by an electron beam or the like before such an insulation tension oxide coating is formed, the introduced strains would disappear during formation of the insulation tension oxide coating, so that the effect of magnetic domain refining is reduced.

When laser irradiation is employed as the method of non-heat resistant type magnetic domain refining, a laser beam may be reflected by a smoothed surface of the steel sheet, resulting in lower energy irradiation efficiency. Therefore, electron beam irradiation is more preferred than laser irradiation.

<Annealing>

When the grain oriented electrical steel sheet according to embodiments of the invention is used as an iron core of a transformer or the like, the grain oriented electrical steel sheet of the invention may be subjected to annealing for the purpose of, inter alia, removing strains.

The temperature during annealing is preferably not lower than 700° C. but not higher than 900° C. The temperature of lower than 700° C. may make it difficult to remove strains. On the other hand, the temperature of higher than 900° C. tends to impair the coating adhesion property.

The soaking time in annealing preferably ranges from 0.2 to 3 hours. With a soaking time of less than 0.2 hours, strains may not be completely removed. On the other hand, when the soaking time exceeds 3 hours, the coating adhesion property may deteriorate, resulting in increased iron loss.

EXAMPLES

The present invention will be specifically described below with reference to examples. However, the present invention should not be construed as being limited to the following examples.

Test Example 1: ZrSiN-Containing Coating and Insulation Tension Oxide Coating (Non-Heat Resistant Type Magnetic Domain Refining)

<Production of Grain Oriented Electrical Steel Sheet>

A steel sheet after secondary recrystallization having a forsterite coating with a steel composition including, in percentage by mass, C in an amount of 20 ppm and Si in an amount of 3.4% (sheet thickness, 0.23 mm; average grain size, 28 to 35 mm; average $\beta$ angle, 2.0°) was prepared.

The forsterite coating of the prepared steel sheet after secondary recrystallization was removed by use of a mixture of hydrochloric acid, hydrogen fluoride and nitric acid; subsequently, chemical polishing was carried out using an aqueous solution obtained by mixing an aqueous hydrogen fluoride solution (47%) and an aqueous hydrogen peroxide solution (34.5%) at a ratio of 1:20 to thereby reduce the sheet thickness to 0.20 mm; and the surface was smoothed to Ra of 0.1 μm or less. Thus, a steel sheet was obtained.

After smoothing, the steel sheet was immediately placed in a vacuum tank, and then Ti ions accelerated by −1000 V bias voltage were caused to collide against the top and bottom surfaces of the steel sheet for 1 minute to remove, from the surfaces, an oxide having been inevitably formed after chemical polishing.

Subsequently, a ceramic coating having an average coating thickness of 0.05 μm and containing ZrSiN as a nitride was formed on the top surface of the steel sheet by the AIP method under the conditions at a bias voltage of −150 V and a coating formation rate of 1.0 nm/s.

Thereafter, a treatment solution was applied over the ceramic coating with a roll coater and baked in a nitrogen atmosphere at 900° C. for 60 seconds, thereby forming a phosphate-based, insulation tension oxide coating. In this process, the line tension was set to 10 MPa. The insulation tension oxide coating had a coating thickness of 3.6 μm on one side. The tension of the insulation tension oxide coating is shown in Table 1 below.

For the treatment solution, used was a treatment solution containing 100 parts by mass of magnesium phosphate (magnesium phosphate monobasic), 80 parts by mass of colloidal silica (AT-30 manufactured by ADEKA Corporation; average particle size, 10 nm) and 20 parts by mass of chromic anhydride (which solution was also used in Test examples 2 to 6 described below).

Thus, a grain oriented electrical steel sheet composed of the steel sheet, the ceramic coating and the insulation tension oxide coating was produced. Subsequently, the grain oriented electrical steel sheet was irradiated with an electron beam to carry out magnetic domain refining.

<Evaluation>

The Young's modulus of the ceramic coating was 350 GPa.

It was observed by the X-ray diffraction method that ZrSiN of the ceramic coating had a crystal structure similar to that of ZrN of cubic crystal system and the highest diffraction peak was {220}. Ipeak1/Ipeak2 was 1.5.

Element analysis using STEM-EDX (Scanning Transmission Electron Microscope—Energy Dispersive X-ray Analysis) revealed that the surface layer in the ceramic coating on the insulation tension oxide coating side was solely oxidized (i.e., an oxide was formed in the surface layer). The oxide formed could not be identified by the X-ray diffraction method and the like but was determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 1 below.

TABLE 1

| No. | Tension of insulation tension oxide coating [MPa] | $B_8$ [T] | $W_{17/50}$ [W/kg] | Minimum bending diameter [mm] | Remarks |
|---|---|---|---|---|---|
| 1 | 18 | 1.964 | 0.690 | 30 | Inventive example |

Test Example 2: CrSiMN-Containing Ceramic Coating and Insulation Tension Oxide Coating (Non-Heat Resistant Type Magnetic Domain Refining)

<Production of Grain Oriented Electrical Steel Sheet>

A steel sheet after secondary recrystallization having a forsterite coating with a steel composition including, in percentage by mass, C in an amount of 20 ppm and Si in an amount of 3.4% (sheet thickness, 0.23 mm; average grain size, 28 to 35 mm; average β angle, 2.0°) was prepared.

The forsterite coating of the prepared steel sheet after secondary recrystallization was removed by use of a mixture of hydrochloric acid, hydrogen fluoride and nitric acid; subsequently, chemical polishing was carried out using an aqueous solution obtained by mixing an aqueous hydrogen fluoride solution (47%) and an aqueous hydrogen peroxide solution (34.5%) at a ratio of 1:20 to thereby reduce the sheet thickness to 0.20 mm; and the surface was smoothed to Ra of 0.1 μm or less. Thus, a steel sheet was obtained.

After smoothing, the steel sheet was immediately placed in a vacuum tank, and then Ti ions accelerated by −800 V bias voltage were caused to collide against the top and bottom surfaces of the steel sheet for 1 minute to remove, from the surfaces, an oxide having been inevitably formed after chemical polishing.

Subsequently, a ceramic coating having an average coating thickness of 0.07 to 0.15 μm and containing CrSiMN as a nitride was formed on the top surface of the steel sheet by the AIP method under the conditions at a bias voltage of −200 V and a coating formation rate of 0.5 nm/s. "M" herein refers to one element among Mo, Nb, Ta, Hf, W and Y (see Table 2 below). M was changed by changing the type of alloy steel used as the target.

Thereafter, the treatment solution was applied over the ceramic coating with a roll coater and baked in a nitrogen atmosphere at 900° C. for 60 seconds, thereby forming a phosphate-based, insulation tension oxide coating. In this process, the line tension was set to 10 MPa. The insulation tension oxide coating had a coating thickness of 3.6 μm on one side. The tension of the insulation tension oxide coating is shown in Table 2 below.

Thus, a grain oriented electrical steel sheet composed of the steel sheet, the ceramic coating and the insulation tension oxide coating was produced. Subsequently, the grain oriented electrical steel sheet was irradiated with an electron beam to carry out magnetic domain refining.

<Evaluation>

The Young's modulus of the ceramic coating was 330 GPa in each case.

It was observed by the X-ray diffraction method that CrSiMN of the ceramic coating had a crystal structure similar to that of CrN of cubic crystal system. Ipeak1/Ipeak2 was not less than 1.5.

Element analysis using STEM-EDX revealed that the surface layer in the ceramic coating on the insulation tension oxide coating side was solely oxidized (i.e., an oxide was formed in the surface layer). The oxide formed was determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 2 below.

TABLE 2

| No. | M | Tension of insulation tension oxide coating [MPa] | $B_8$ [T] | $W_{17/50}$ [W/kg] | Minimum bending diameter [mm] | Remarks |
|---|---|---|---|---|---|---|
| 2 | Mo | 20 | 1.962 | 0.659 | 20 | Inventive example |
| 3 | Nb | 18 | 1.962 | 0.671 | 30 | Inventive example |
| 4 | Ta | 20 | 1.962 | 0.654 | 20 | Inventive example |
| 5 | Hf | 18 | 1.962 | 0.694 | 30 | Inventive example |
| 6 | W | 18 | 1.962 | 0.659 | 20 | Inventive example |
| 7 | Y | 20 | 1.962 | 0.663 | 30 | Inventive example |

Test Example 3: AlCrN-Containing Ceramic Coating and Insulation Tension Oxide Coating (Non-Heat Resistant Type Magnetic Domain Refining)

<Production of Grain Oriented Electrical Steel Sheet>

A steel sheet after secondary recrystallization having a forsterite coating with a steel composition including, in percentage by mass, C in an amount of 20 ppm and Si in an amount of 3.4% (sheet thickness, 0.23 mm; average grain size, 28 to 35 mm; average β angle, 2.0°) was prepared.

The forsterite coating of the prepared steel sheet after secondary recrystallization was removed by use of a mixture of hydrochloric acid, hydrogen fluoride and nitric acid; subsequently, chemical polishing was carried out using an aqueous solution obtained by mixing an aqueous hydrogen fluoride solution (47%) and an aqueous hydrogen peroxide solution (34.5%) at a ratio of 1:20 to thereby reduce the sheet thickness to 0.20 mm; and the surface was smoothed to Ra of 0.1 μm or less. Thus, a steel sheet was obtained.

After smoothing, the steel sheet was immediately placed in a vacuum tank, and then Ti ions accelerated by −1000 V bias voltage were caused to collide against the top and bottom surfaces of the steel sheet for 1 minute to remove, from the surfaces, an oxide having been inevitably formed after chemical polishing.

Subsequently, a ceramic coating having an average coating thickness of 0.15 μm and containing AlCrN as a nitride was formed on the top surface of the steel sheet by the AIP method under the conditions at a bias voltage of −150 V and a coating formation rate of 1.0 nm/s.

Thereafter, the treatment solution was applied over the ceramic coating with a roll coater and baked in a nitrogen atmosphere at 900° C. for 60 seconds, thereby forming a phosphate-based, insulation tension oxide coating. In this process, the line tension was set to 10 MPa. The insulation tension oxide coating had a coating thickness of 3.6 μm on one side. The tension of the insulation tension oxide coating is shown in Table 3 below.

Thus, a grain oriented electrical steel sheet composed of the steel sheet, the ceramic coating and the insulation tension oxide coating was produced. Subsequently, the grain oriented electrical steel sheet was irradiated with an electron beam to carry out magnetic domain refining.

<Evaluation>

The Young's modulus of the ceramic coating was 320 GPa.

It was observed through X-ray diffraction measurement that AlCrN of the ceramic coating had a crystal structure similar to that of AlN of cubic crystal system and the highest diffraction peak was {111}. Ipeak1/Ipeak2 was 2.0.

Element analysis using STEM-EDX revealed that the surface layer in the ceramic coating on the insulation tension oxide coating side was solely oxidized (i.e., an oxide was formed in the surface layer). The oxide formed could not be identified by the X-ray diffraction method and the like but was determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 3 below.

TABLE 3

| No. | Tension of insulation tension oxide coating [MPa] | $B_8$ [T] | $W_{17/50}$ [W/kg] | Minimum bending diameter [mm] | Remarks |
| --- | --- | --- | --- | --- | --- |
| 8 | 21 | 1.961 | 0.668 | 10 | Inventive example |

Test Example 4: AlSiCrN-Containing Ceramic Coating and Insulation Tension Oxide Coating (Heat Resistant Type Magnetic Domain Refining)

<Production of Grain Oriented Electrical Steel Sheet>

A steel sheet after secondary recrystallization having a forsterite coating with a steel composition including, in percentage by mass, C in an amount of 20 ppm and Si in an amount of 3.4% (sheet thickness, 0.23 mm; average grain size, 30 mm; average β angle, 2.0°) and also having 30 μm-deep grooves that extend in the width direction of the sheet and that are arranged in the rolling direction at regular intervals of 3 mm, was prepared.

The forsterite coating of the prepared steel sheet after secondary recrystallization was removed by use of a mixture of hydrochloric acid, hydrogen fluoride and nitric acid to reduce the sheet thickness to 0.210 mm; thereafter, electrolytic polishing was carried out using an aqueous solution of NaCl as the electrolytic solution to reduce the sheet thickness to 0.200 mm; and the surface was smoothed to Ra of 0.1 μm or less. Thus, a steel sheet was obtained.

After smoothing, the steel sheet was immediately placed in a vacuum tank, and then Ti ions accelerated by −800 V bias voltage were caused to collide against the top and bottom surfaces of the steel sheet for 3 minutes to remove, from the surfaces, an oxide having been inevitably formed after chemical polishing.

Subsequently, a ceramic coating having an average coating thickness of 0.0.10 μm and containing AlSiCrN as a nitride was formed on the top surface of the steel sheet by the AIP method under the conditions at a bias voltage of −250 V and a coating formation rate of 1.0 nm/s.

Thereafter, the treatment solution was applied over the ceramic coating with a roll coater and baked in a nitrogen atmosphere at 900° C. for 60 seconds, thereby forming an insulation tension oxide coating. In this process, the line tension was set to 10 MPa. The insulation tension oxide coating had a coating thickness of 1.0 μm or 3.0 μm on one side (see Table 4 below). The tension of the insulation tension oxide coating is shown in Table 4 below.

Thus, a grain oriented electrical steel sheet composed of the steel sheet, the ceramic coating and the insulation tension oxide coating was produced. The resulting grain oriented electrical steel sheet was then subjected to annealing, which simulates stress relief annealing, at 800° C. for 3 hours in a nitrogen atmosphere.

<Evaluation>

The Young's modulus of the ceramic coating was 330 GPa.

It was observed through X-ray diffraction measurement that AlSiCrN of the ceramic coating had a crystal structure similar to that of AlN of cubic crystal system and the highest diffraction peak was {200}. Ipeak1/Ipeak2 was 6.1.

Element analysis using STEM-EDX revealed that the surface layer in the ceramic coating on the insulation tension oxide coating side was solely oxidized (i.e., an oxide was formed in the surface layer). The oxide formed was determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 4 below.

TABLE 4

| No. | Insulation tension oxide coating Coating thickness on one side [μm] | Tension [MPa] | $B_8$ [T] | $W_{17/50}$ [W/kg] | Minimum bending diameter [mm] | Remarks |
|---|---|---|---|---|---|---|
| 9 | 1.0 | 6 | 1.934 | 0.758 | 10 | Comparative example |
| 10 | 3.0 | 16 | 1.938 | 0.693 | 10 | Inventive example |

Test Example 5: TiN-Containing Ceramic Coating and Insulation Tension Oxide Coating (Non-Heat Resistant Type Magnetic Domain Refining)

<Production of Grain Oriented Electrical Steel Sheet>

A steel sheet after secondary recrystallization having a forsterite coating with a steel composition including, in percentage by mass, C in an amount of 20 ppm and Si in an amount of 3.4% (sheet thickness, 0.23 mm; average grain size, 28 to 35 mm; average β angle, 2.0°) was prepared.

The forsterite coating of the prepared steel sheet after secondary recrystallization was removed by use of a mixture of hydrochloric acid, hydrogen fluoride and nitric acid; subsequently, chemical polishing was carried out using an aqueous solution obtained by mixing an aqueous hydrogen fluoride solution (47%) and an aqueous hydrogen peroxide solution (34.5%) at a ratio of 1:20 to thereby reduce the sheet thickness to 0.20 mm; and the surface was smoothed to Ra of 0.1 μm or less. Thus, a steel sheet was obtained.

After smoothing, the steel sheet was immediately placed in a vacuum tank, and then Ti ions accelerated by −1000 V bias voltage were caused to collide against the top and bottom surfaces of the steel sheet for 1 minute to remove, from the surfaces, an oxide having been inevitably formed after chemical polishing.

Subsequently, a ceramic coating having an average coating thickness of 0.10 μm and containing TiN as a nitride was formed on the top surface of the steel sheet by the AIP method under the conditions at a bias voltage of −300 V and a coating formation rate of 1.0 nm/s.

Thereafter, the TiN coating was applied with the treatment solution with a roll coater and baked in a nitrogen atmosphere at 900° C. for 60 seconds, thereby forming a phosphate-based, insulation tension oxide coating. In this process, the line tension was set to 10 MPa. The insulation tension oxide coating had a coating thickness of 3.6 μm on one side. The tension of the insulation tension oxide coating is shown in Table 5 below.

Thus, a grain oriented electrical steel sheet composed of the steel sheet, the ceramic coating and the insulation tension oxide coating was produced. Subsequently, the grain oriented electrical steel sheet was irradiated with an electron beam to carry out magnetic domain refining.

<Evaluation>

The Young's modulus of the ceramic coating was 300 GPa.

It was observed by the X-ray diffraction method that TiN of the ceramic coating had a crystal structure similar to that of TiN of cubic crystal system and the highest diffraction peak was {200}. Ipeak1/Ipeak2 was 6.4.

Element analysis using STEM-EDX revealed that the surface layer in the ceramic coating on the insulation tension oxide coating side was solely oxidized (i.e., an oxide was formed in the surface layer). The oxide formed was not determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 5 below.

TABLE 5

| No. | Tension of insulation tension oxide coating [MPa] | $B_8$ [T] | $W_{17/50}$ [W/kg] | Minimum bending diameter [mm] | Remarks |
|---|---|---|---|---|---|
| 11 | 8 | 1.957 | 0.735 | 20 | Comparative example |

(Test Example 6: CrN-Containing Ceramic Coating and Insulation Tension Oxide Coating (Non-Heat Resistant Type Magnetic Domain Refining)

<Production of Grain Oriented Electrical Steel Sheet>

A steel sheet after secondary recrystallization having a forsterite coating with an average β angle of 3.3° or 2.1° (see Table 6 below) and a steel composition including, in percentage by mass, C in an amount of 20 ppm and Si in an amount of 3.4% (sheet thickness, 0.23 mm; average grain size, 28 to 35 mm) was prepared.

The forsterite coating of the prepared steel sheet after secondary recrystallization was removed by use of a mixture of hydrochloric acid, hydrogen fluoride and nitric acid; subsequently, chemical polishing was carried out using an aqueous solution obtained by mixing an aqueous hydrogen fluoride solution (47%) and an aqueous hydrogen peroxide solution (34.5%) at a ratio of 1:20 to thereby reduce the sheet thickness to 0.20 mm; and the surface was smoothed to Ra of 0.1 μm or less. Thus, a steel sheet was obtained.

After smoothing, the steel sheet was immediately placed in a vacuum tank, and then Ti ions accelerated by −1000 V bias voltage were caused to collide against the top and bottom surfaces of the steel sheet for 1 minute to remove, from the surfaces, an oxide having been inevitably formed after chemical polishing.

Subsequently, a ceramic coating having an average coating thickness of 0.20 μm and containing CrN as a nitride was formed on the top surface of the steel sheet by the AIP method under the conditions at a bias voltage of −60 V and a coating formation rate of 1.0 nm/s.

Thereafter, the treatment solution was applied over the ceramic coating with a roll coater and baked in a nitrogen atmosphere at 900° C. for 60 seconds, thereby forming a phosphate-based, insulation tension oxide coating. In this process, the line tension was set to 10 MPa. The insulation tension oxide coating had a coating thickness of 3.6 μm on one side. The tension of the insulation tension oxide coating is shown in Table 6 below.

Thus, a grain oriented electrical steel sheet composed of the steel sheet, the ceramic coating and the insulation tension oxide coating was produced. Subsequently, the grain oriented electrical steel sheet was irradiated with an electron beam to carry out magnetic domain refining.

<Evaluation>

The Young's modulus of the ceramic coating was 280 GPa.

It was observed through X-ray diffraction measurement that CrN of the ceramic coating had a crystal structure similar to that of CrN of cubic crystal system and the highest diffraction peak was {111}. Ipeak1/Ipeak2 was 1.8.

Element analysis using STEM-EDX revealed that the surface layer in the ceramic coating on the insulation tension oxide coating side was solely oxidized (i.e., an oxide was formed in the surface layer). The oxide formed was determined to have a corundum type crystal structure by the electron diffraction method.

For the obtained grain oriented electrical steel sheet, the magnetic flux density $B_8$ (unit: T) and the iron loss $W_{17/50}$ (unit: W/kg) were measured as its magnetic properties. Further, the minimum bending diameter (unit: mm) was measured by the round bar winding method to evaluate the coating adhesion property. The results are shown in Table 6 below.

TABLE 6

| No. | β angle [°] | Tension of insulation tension oxide coating [MPa] | $B_8$ [T] | $W_{17/50}$ [W/kg] | Minimum bending diameter [mm] | Remarks |
|---|---|---|---|---|---|---|
| 12 | 3.3 | 21 | 1.943 | 0.703 | 10 | Inventive example |
| 13 | 2.1 | 20 | 1.965 | 0.686 | 10 | Inventive example |

The results of Test examples 1 to 6 (Tables 1 to 6) revealed that the grain oriented electrical steel sheets of Nos. 1 to 8, 10 and 12 to 13 (Inventive examples) had smaller iron losses $W_{17/50}$ and thus more excellent magnetic properties and also smaller minimum bending diameters and thus more excellent coating adhesion property than the grain oriented electrical steel sheets of Nos. 9 and 11 (Comparative examples).

Comparing the grain oriented electrical steel sheets of Nos. 1 to 8, 10 and 12 to 13, the grain oriented electrical steel sheet in which a nitride in the ceramic coating was. AlCrN (No. 8), AlSiCrN (No. 10) or CrN (Nos. 12 to 13) showed a further smaller minimum bending diameter, thus achieving an even more excellent coating adhesion property.

The invention claimed is:

1. A grain oriented electrical steel sheet comprising a steel sheet, a ceramic coating disposed on the steel sheet, and an insulation tension oxide coating disposed on the ceramic coating,
wherein the ceramic coating includes a nitride and an oxide,
wherein the nitride contains at least one element selected from the group consisting of elements of Cr, Ti, Zr, Mo, Nb, Si, Al, Ta, Hf, W and Y,
wherein the oxide has a corundum type crystal structure,
wherein a Young's modulus of the ceramic coating measured by a nanoindentation method is not less than 230 GPa,
wherein the ceramic coating has an average coating thickness of not less than 0.01 μm but not more than 0.30 μm, and
wherein the insulation tension oxide coating has a tension of not less than 10 MPa.

2. The grain oriented electrical steel sheet according to claim 1, wherein the ceramic coating contains the oxide in its surface layer on the insulation tension oxide coating side.

3. The grain oriented electrical steel sheet according to claim 2, wherein the nitride has a crystal structure of cubic crystal system.

4. The grain oriented electrical steel sheet according to claim 3, wherein the nitride contains two or more of the elements.

5. The grain oriented electrical steel sheet according to claim 4, wherein a crystal orientation of the nitride accumulates in one of orientations {111}, {100} and {110}.

6. The grain oriented electrical steel sheet according to claim 3, wherein a crystal orientation of the nitride accumulates in one of orientations {111}, {100} and {110}.

7. The grain oriented electrical steel sheet according to claim 2, wherein the nitride contains two or more of the elements.

8. The grain oriented electrical steel sheet according to claim 1, wherein the nitride has a crystal structure of cubic crystal system.

9. The grain oriented electrical steel sheet according to claim 1, wherein the nitride contains two or more of the elements.

10. The grain oriented electrical steel sheet according to claim 1, wherein a crystal orientation of the nitride accumulates in one of orientations {111}, {100} and {110}.

11. The grain oriented electrical steel sheet according to claim 1, wherein the nitride contains at least one element selected from the group consisting of elements of Cr and Al.

12. The grain oriented electrical steel sheet according to claim 1, wherein the nitride is selected from the group consisting of ZrSiN, CrN, AlCrN, AlSiCrN, CrSiMoN, CrSiNbN, CrSiTaN, CrSiHfN, CrSiWN, and CrSiYN.

13. The grain oriented electrical steel sheet according to claim 1, wherein the insulation tension oxide coating contains an oxide derived from a phosphate in an amount of not less than 85 mass %.

14. A method of producing the grain oriented electrical steel sheet according to claim 1, the method comprising forming the ceramic coating on the steel sheet by ark ion plating and disposing the insulation tension oxide coating on the ceramic coating, thereby forming the grain oriented electrical steel sheet.

15. The method of producing the grain oriented electrical steel sheet according to claim 14, further comprising using a roll coater for disposing the insulation tension oxide coating on the ceramic coating.

16. A method of producing the grain oriented electrical steel sheet according to claim 4, wherein the ceramic coating is formed by an ark ion plating method.

17. A method of producing the grain oriented electrical steel sheet according to claim 5, wherein the ceramic coating is formed by an ark ion plating method.

18. A method of producing the grain oriented electrical steel sheet according to claim 7, wherein the ceramic coating is formed by an ark ion plating method.

19. The method of producing the grain oriented electrical steel sheet according to claim 18, wherein a roll coater is used in formation of the insulation tension oxide coating.

20. The method of producing the grain oriented electrical steel sheet according to claim 16, wherein a roll coater is used in formation of the insulation tension oxide coating.

21. The method of producing the grain oriented electrical steel sheet according to claim 17, wherein a roll coater is used in formation of the insulation tension oxide coating.

* * * * *